United States Patent [19]
Rheinfelder

[11] 3,978,422
[45] Aug. 31, 1976

[54] BROADBAND AUTOMATIC GAIN CONTROL AMPLIFIER

[75] Inventor: William A. Rheinfelder, Phoenix, Ariz.

[73] Assignee: Alpha Engineering Corporation

[22] Filed: Feb. 28, 1975

[21] Appl. No.: 553,924

[52] U.S. Cl. .............................. 330/132; 330/30 R; 330/126; 330/134; 330/141
[51] Int. Cl.² ......................................... H03G 5/16
[58] Field of Search .............. 330/29, 52, 132, 133, 330/134, 141; 325/404

[56] References Cited
UNITED STATES PATENTS

| | | | |
|---|---|---|---|
| 2,521,507 | 9/1950 | Dysart | 330/52 X |
| 3,323,066 | 5/1967 | Kurtz | 325/403 |
| 3,781,903 | 12/1973 | Duty | 330/134 X |

Primary Examiner—James B. Mullins
Attorney, Agent, or Firm—Cahill, Sutton & Thomas

[57] ABSTRACT

A broadband automatic gain control amplifier is described incorporating a plurality of gain control loops, each responsive to signal levels at the output of the amplifier at different frequencies for developing a control signal to correct the output signal level simultaneously at that frequency and at other frequencies. Each of the gain control loops providing unique gain-frequency characteristic with respect to the other gain control loops.

5 Claims, 8 Drawing Figures

BROADBAND AUTOMATIC GAIN CONTROL AMPLIFIER

The present invention pertains to automatic gain control amplifiers and more particularly to AGC amplifiers for use in broadband applications.

In many applications, such as cable television, amplifiers are spaced along a main trunk to amplify the signals being transmitted thereon and to compensate for the attenuation caused by the cables. The amplifiers are typically spaced at predetermined intervals along the cable and amplify the signals in a predetermined manner to compensate for the frequency-dependent attenuation on the signal imposed by the cable. Since the frequencies of the higher channels in the television spectrum are higher than the frequencies of the lower channels, attenuation of the higher channels is greater and the amplifiers must therefore provide a higher gain thereto. The physical spacing between amplifiers is usually chosen at a predetermined length, depending on the type of cable; for example, an amplifier spacing of 22 db loss at the highest frequency may be chosen and provides a value for determining the physical spacing.

A discussion of the requirements for signal transmission over a TV cable, including a discussion of gain and tilt, is given in my co-pending application Ser. No. 528,459, filed Nov. 29, 1974, entitled "Modular CATV System". As stated therein, a typical distribution system will have a 22 db spacing between amplifiers with such amplifiers providing a gain ranging from a high at the Channel 13 frequency to a low at the Channel 2 frequency. The term "tilt" as described in said application, refers to the different levels of gain provided to the highest and lowest frequencies to compensate for the different attenuation experienced by each of the frequencies during its transmission from the preceding amplifier.

In addition to the requirement to compensate for cable attenuation, the automatic gain control amplifier described herein is designed to compensate for the adverse effects on signals caused by deviations from nominal amplifier spacing, the utilization of jumper cables, effects of temperature changes, cable aging, improper field adjustments, wave length errors and the like.

Attempts have been made in the prior art to provide an automatic gain-control function with an AGC amplifier controlled by a pilot frequency superimposed on the 12 different television channels as a means for controlling the automatic gain. The use of such a pilot frequency was an attempt to solve the problem of controlling gain of the transmitted signal and to obviate the problem caused by controlling gain on a television channel frequency when such channel was not being used; however, controlling on only a single frequency does not provide a means for automatically controlling the gain throughout the entire band of CATV frequencies. It is therefore possible with such prior art AGC systems to have a well controlled, closed-loop system at the pilot frequency while substantial errors are experienced in the remaining channels. While it would be possible to split the signal being carried on the cable into 12 separate channel frequencies and to provide an AGC system for each such channel, the cost becomes prohibitive. If, on the other hand, an attempt were made to use additional pilot frequencies, intermodulation becomes a serious problem requiring an even more complex and expensive design remedy.

It is therefore an object of the present invention to provide a broadband AGC system for controlling gain over a range of frequencies commensurate with the frequency spectrum of cable television.

It is another object of the present invention to provide an automatic gain-control amplifier that will control the gain of the amplifier throughout a range of frequencies while permitting the amplifier to increase the gain of higher frequencies more than the gain of the lower frequencies.

It is still another object of the present invention to provide a broadband AGC system utilizing different gain-frequency characteristics at different predetermined frequencies within the frequency spectrum to develop control signals to implement gain control.

It is yet another object of the present invention to provide a broadband AGC system wherein gain corrections are derived from a plurality of AGC modules, each designed for a specific frequency within the frequency spectrum of the system and each having a different gain-frequency characteristic.

These and other objects of the present invention will become apparent to those skilled in the art as the description thereof proceeds.

The present invention may readily be described by reference to the accompanying drawings in which.

Figure 1:
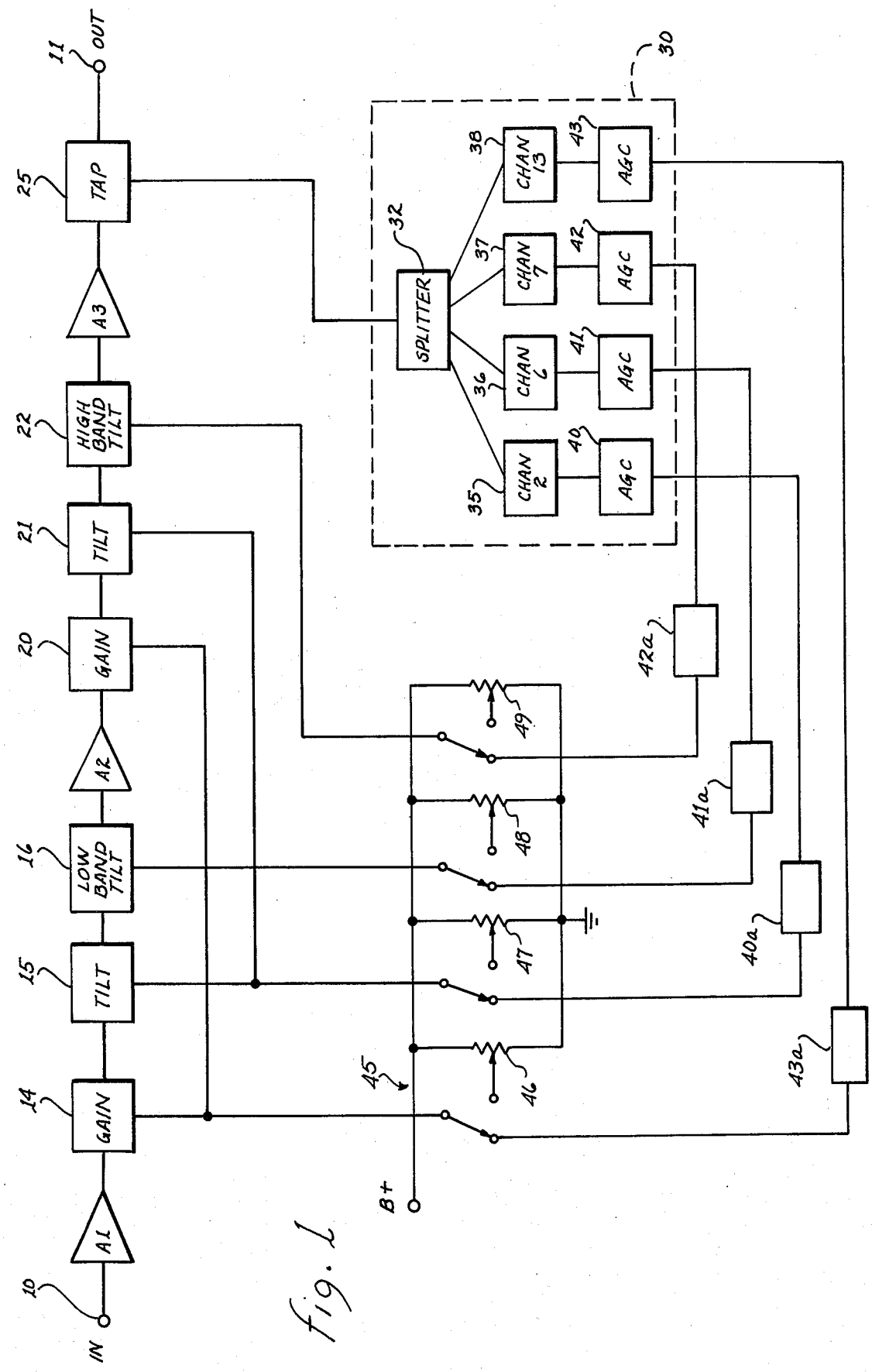
FIG. 1 is a block diagram of an AGC amplifier constructed in accordance with the teachings of the present invention.

Referring to FIG. 1, a block diagram of an AGC amplifier constructed in accordance with the teachings of the present invention is shown. In the embodiment chosen for illustration in FIG. 1, three transistor amplifiers A1, A2 and A3 are shown connected to receive an input signal at the terminal 10 and to provide an output signal at the terminal 11. Gain-controlling components 14, 15 and 16 are connected in the main signal path between amplifiers 1 and 2. Similarly, gain-controlling components 20, 21 and 22 are connected between amplifiers A2 and A3. Gain-controlling components 14 and 20 will simply be referred to as the overall gain-controlling elements which affect or control the gain of the system at the highest frequency which has been chosen as the frequency of Channel 13. Gain-controlling components 15 and 21 may be referred to as tilt control and exercise maximum control at the lowest frequency or the frequency of Channel 2. It may be noted that the components 14 and 20 are connected in parallel and exercise gain control at the interstage connections between all three amplifiers; similarly, the tilt controls 15 and 21 are connected in parallel and exercise control functions at the interstage connection of the amplifiers.

Gain-controlling component 16 is connected to exercise maximum control at an intermediate frequency, Channel 6, and exercises a relatively minor correction and is designated as a lowband tilt gain control component. Gain-controlling component 22 is connected to exercise maximum control at an intermediate frequency, Channel 7, and is designated as the highband tilt control component.

Gain-controlling components, such as those discussed above may take a variety of forms. Usually, a variable capacitance diode is inserted in series between amplifiers with a DC-control voltage applied across the diode. The capacitance of the diode will vary in accordance with the applied DC-control voltage. Typical of such diodes is TRW type VC-15. A network may also be used incorporating such diodes as gain-controlling components. Additional discussion of the use of such gain-controlling components may be found in CATV Circuit Engineering by William A. Rheinfelder, 1975 (Library of Congress Card Number 74-25566).

A tapping device 25 is connected to sample the output of amplifier A3 and provide the signal thus derived to a feedback network 30. The feedback network 30 includes a splitter 32 which provides a sampled signal to active filters 35, 36, 37 and 38 corresponding to Channels 2, 6, 7 and 13, respectively. The filters are tuned to pass the frequencies of the corresponding channels and apply the filtered signal to one of the AGC modules 40–43.

The signal levels supplied to the AGC modules from the active filters are rectified in the modules and compared to a reference voltage to derive a DC control voltage. The DC control voltage derived by AGC module 40 is applied through time constant network 40a to gain-controlling components 15 and 21; the DC control voltage developed in the AGC module 43 is applied through time constant network 43a to gain-controlling components 14 and 20. DC control voltages developed in AGC modules 41 and 42 are applied through time constant networks 41a and 42a to gain-controlling components 16 and 22, respectively. It may therefore be seen that DC control signals are developed in the AGC modules 40–43 for frequencies corresponding to Channels 2, 6, 7 and 13. These control signals are applied to gain-controlling components 14 through 16 and 20 through 22 to provide a controlled gain at the output terminal 11 corresponding to a predetermined, desired response.

Figure 8:
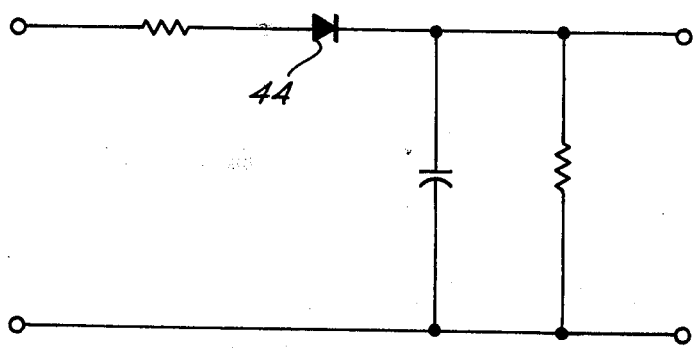
FIG. 8 is a circuit diagram of a time constant circuit shown in FIG. 1.

The time constant networks 40a–43a are as shown in FIG. 8. The diode 44 provides different attack and release times, thereby effectively causing the AGC loop to be controlled by the peak of the sync pulse of a TV signal, rather than the average value.

A four-pole, double-throw switch 45 may be incorporated in the system to facilitate maintenance and permit checking of control functions. The switch 45 may include miniature potentiometers 46 through 49 to facilitate checking the control functions.

Figure 2:
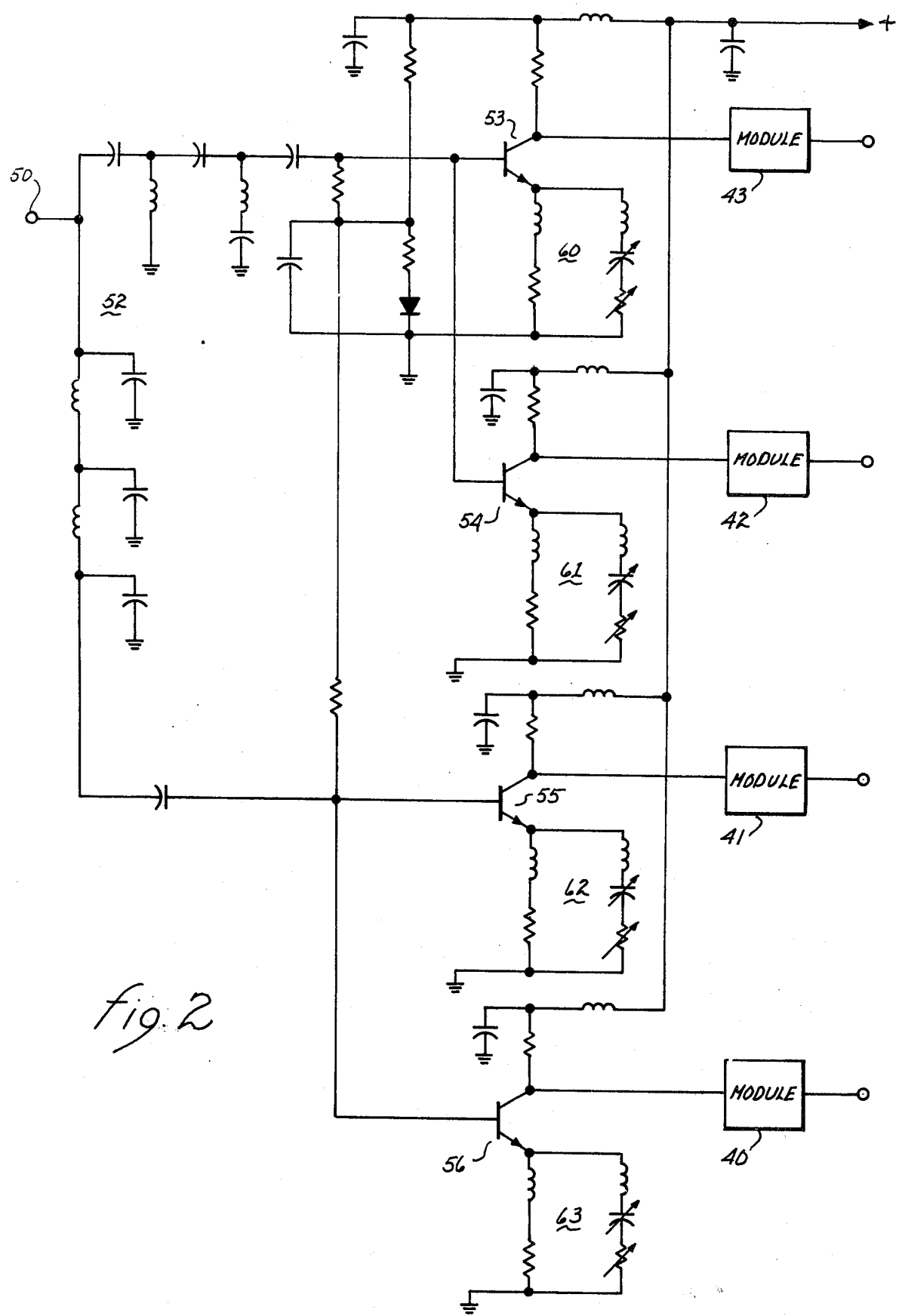
FIG. 2 is a schematic circuit diagram of the splitter and active filters of FIG. 1.

Referring now to FIG. 2, the feedback network 30 is shown in greater detail. The signal derived by tapping the output of amplifier stage A3 (FIG. 1) is applied to terminal 50 and may be split as by the splitter 32 of FIG. 1, or, alternatively, may be divided into the appropriate component frequencies by a filter network 52. Transistors 53 through 56 each form the basis of an active filter tuned to the respective frequencies of Channels 2, 6, 7 and 13. Each of the transistors 53 through 56 is provided with emitter networks 60 through 63, respectively, to provide selective high Q amplification. The output of each of the active filters is connected to one of the AGC modules 40 through 43. It will be obvious to those skilled in the art that other circuits may be utilized to derive signals from the tapped output of the amplifier at predetermined frequencies; a variety of splitter networks or filter schemes may be used as well as other amplifier techniques for amplifying the individual frequency signals corresponding to the respective channels. The circuit shown in FIG. 2 has been found to have excellent operating characteristics and is believed to be the most desirable circuit for use in the amplifying system of the present invention.

Figure 3:
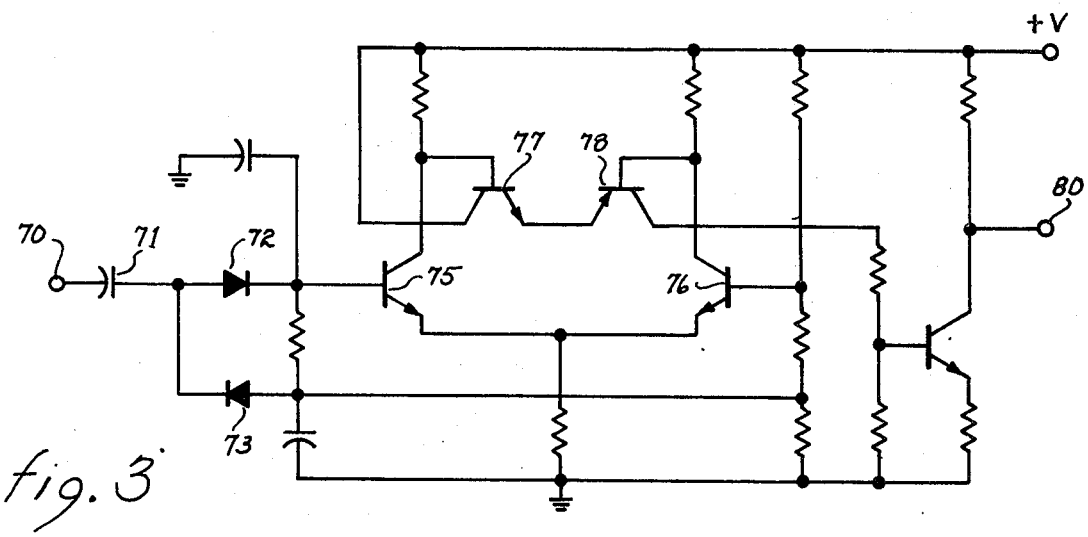
FIG. 3 is a schematic circuit diagram of an AGC module shown in FIG. 2.

Referring now to FIG. 3, the circuit diagram for each of the modules 40 through 43 in FIGS. 1 and 2 is shown. As stated previously, four modules are utilized in the embodiment chosen for illustration, each intended to develop a DC control voltage for a different predetermined frequency in the broadband frequency range. For purposes of description, it will be assumed that the circuit of FIG. 3 corresponds to the circuit of module 43 in FIGS. 1 and 2. The output signal from the active filter provided at the collector electrode of transistor 53 (FIG. 2) is provided to terminal 70 where it is coupled through capacitor 71 to diodes 72 and 73. Diodes 72 and 73 are "back diodes" or tunnel diodes, such as General Electric type BD-3. The diodes 72 and 73 are connected to a differential pair of transistors 75 and 76 which drive a second differential pair of complementary transistors 77 and 78. The final resulting DC voltage presented at terminal 80 is then used as the basis for controlling the gain-controllable components as shown in FIG. 1. The AGC module of FIG. 3 requires a precision power supply which may take a variety of well known forms and which need not be discussed here. The module of FIG. 3 provides an *rf* signal sensor with an output DC control voltage of from one to fourteen volts for an *rf* signal change of 0.1 db and provides stable performance at very low *rf* signal levels.

Figure 4:
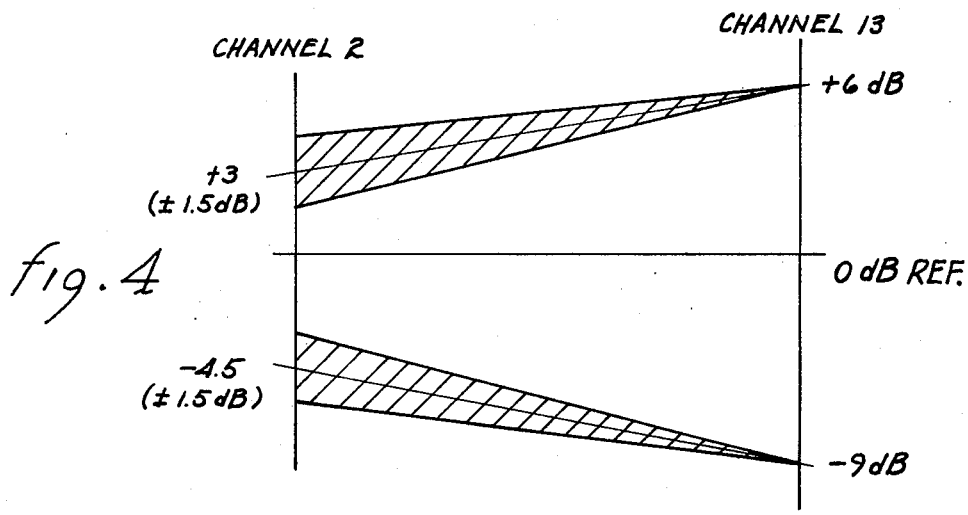
FIG. 4 is a gain-frequency characteristic for the high frequency loop of FIG. 1 useful in describing the operation of FIG. 1.

FIGS. 4 through 7 represent the gain-frequency control characteristics provided by the AGC modules at the desired predetermined frequencies. Referring to FIG. 4, the gain-frequency control characteristic is shown for the highest frequency used to derive a control signal (Channel 13). It may be seen that maximum control of the AGC amplifier system is provided at Channel 13 (within the limits of correction: (+) 6 to (−) 9 db). In the gain-frequency control characteristic of FIG. 4, the amount of control becomes progressively less at lower frequencies, until at Channel 2 the control range is one-half the amount obtained at Channel 13. This characteristic, with one-half the amount of gain control action for one-fourth the frequency, may be difficult to realize in a production amplifier; however, the several gain-control characteristics are provided in such a fashion that their combined action allows the tolerance for each individual gain-control characteristic to be loosened to the point where production becomes practical. In FIG. 4, it is seen that a shaded area is provided which is acceptable due to the action of the other gain-control characteristics described below, although the ideal characteristics remain that indicated as a (+) 3 db change at Channel 2 for a 6 db change at Channel 13 (respectively, a (−) 4.5 db change at Channel 2 for a (−) 9 db change at Channel 13). In this invention the gain-control characteristics are designated in a way that each additional control provides a greater precision to the overall AGC action. Thus, using only one gain-control characteristic as in FIG. 4 will present an automatic gain-control amplifier with major inaccuracies. As the other gain-control characteristics are added, the precision is increased.

Figure 5:
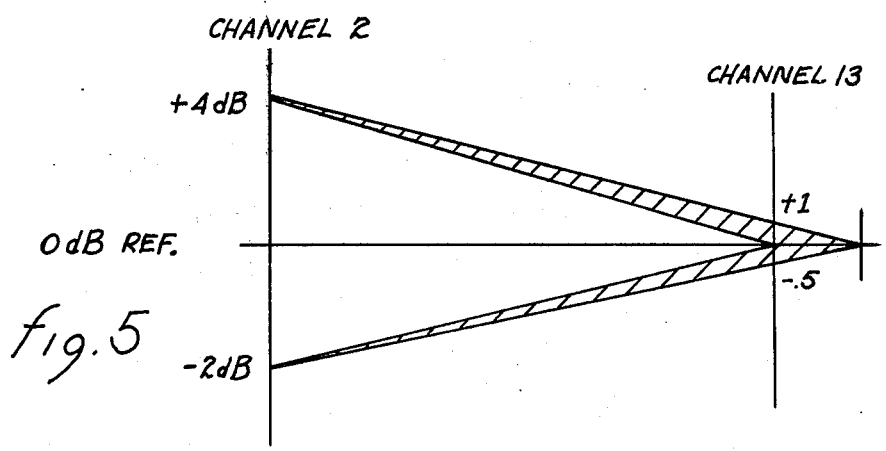
FIG. 5 is a gain-frequency characteristic for the low frequency loop of FIG. 1 useful in describing the operation of FIG. 1.

A second AGC module (module 40 in FIG. 1) is provided and imposes a gain-frequency control characteristic as shown in FIG. 5 with a maximum change at Channel 2 of typically (+) 4 and (−) 2 db, and insignificant change at a frequency slightly above Channel 13. Again, for manufacturing purposes, an allowable range is indicated by the shaded area, with the ideal centered in the shaded area.

When module 43 (Channel 13) and module 40 (Channel 2) are combined, the imprecision of the gain control at one end of the frequency spectrum is compensated by the precision afforded by the second module; therefore, the combined gain-control frequency characteristics impose a gain control on the overall AGC amplifier to arrive at a more nearly ideal overall gain control. In each of FIGS. 4 and 5, the gain control is referenced to a predetermined reference signal level which may readily be chosen to provide a higher gain at the higher frequencies than at the lower frequencies in accordance with the requirements for compensating cable attenuation.

Figure 6:
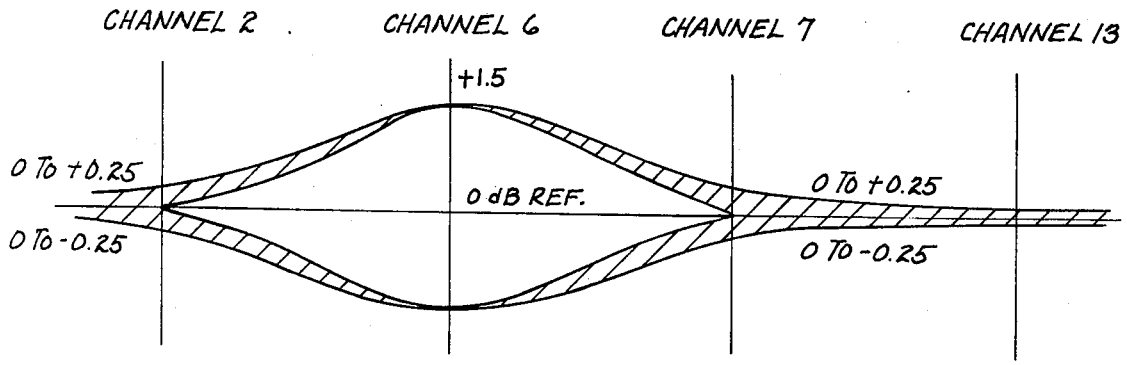
FIG. 6 is a gain-frequency characteristic for the low band frequency loop in FIG. 1 useful in describing the operation of FIG. 1.
Figure 7:
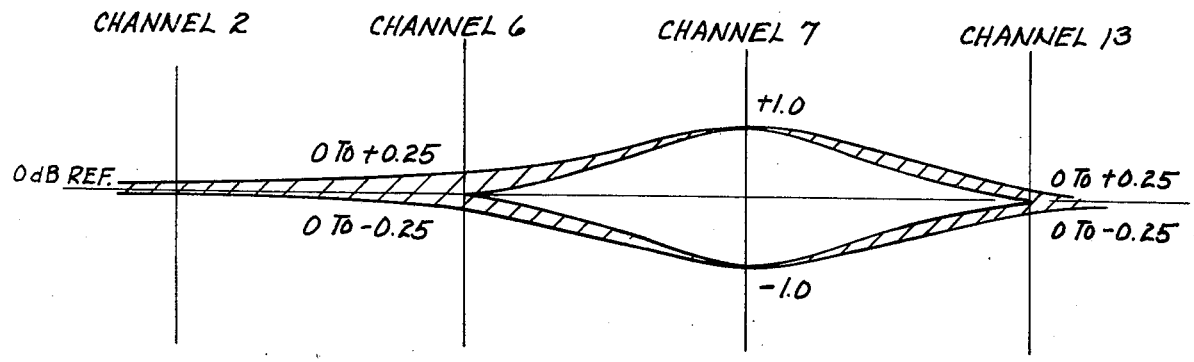
FIG. 7 is a gain-frequency characteristic for the high band frequency loop of FIG. 1 useful in describing the operation of FIG. 1.

FIGS. 6 and 7 show gain-frequency control characteristics for modules 41 and 42, respectively, wherein it may be seen that maximum control is achieved at the frequencies for which the loop was designed with progressively less control away from the center frequency. The shaded areas again indicate permissible limits for production circuits. It is seen that the combination of all gain control characteristics leads to reduced accuracy requirements for each individual characteristic. When the modules 41 and 42 with the gain-frequency control characteristics of FIGS. 6 and 7, respectively, are combined with modules 43 and 40 with the gain-frequency control characteristics of FIGS. 4 and 5, respectively, effective gain control is provided throughout the entire frequency range from Channel 2 to Channel 13. It may be noted that each active or selective filter and corresponding AGC module form a control loop for developing a DC control voltage to be applied to a gain-controlling component in the AGC amplifier. Each of these gain control loops provides a gain-frequency control characteristic different from the characteristic provided by the other control loops. The combined control function of the gain control loops yields a precisely controlled gain throughout the entire frequency range for which the system was designed.

It may therefore be seen that the gain control loop for Channel 13 will control gain at that frequency and will also control the gain of Channel 2 approximately one-half the amount of control of Channel 13. The gain control loop for the frequency at Channel 2 will not significantly affect the gain at Channel 13; the gain control loop for Channel 6 does not significantly affect the gain at Channels 2 or 7 nor does the gain control loop at Channel 7 significantly affect the gain at Channels 6 and 13. A further inspection of the gain control characteristic for the gain control of Channel 2 illustrates that the point of zero control (hinge point) is at a frequency higher than Channel 13. Providing such a control characteristic with the hinge point occurring at a higher frequency than Channel 13 effectively avoids hunting which may occur if the hinge point occurs at a frequency lower than Channel 13. This hunting action is in opposition to the action of the gain control characteristic for Channel 13, thus resulting in a regenerative system with the concommitant undesirable consequences.

The time constant networks such as those shown at 40a and 43a of FIG. 1 may take a form such as that shown in FIG. 8. The RC time constant is chosen so that the charge time (attack time) is extremely fast and the discharge time (release time) is slow. Since the sync pulse is the largest signal amplitude, the AGC bias resulting therefrom would be available almost immediately while the bias would bleed off slowly. The time constant circuit of FIG. 8 therefore effectively provides a peak-reading AGC, DC control voltage unaffected by the signal modulation. The control afforded by each AGC loop is therefore predicated by the peak values of the sync pulse of the TV signal rather than the average value.

I claim:

1. In a wideband amplifier for amplifying signals over a range of frequencies applied to the input thereof and providing the amplified signals to the output thereof, said amplifier including gain-controlling components for controlling gain over predetermined frequency bands in response to control voltages applied thereto, the improvement comprising:
   a. tapping means connected to said output for sampling said output signals;
   b. four frequency-selective filters connected to said tapping means, each filter passing a different predetermined frequency within said range of frequencies;
   c. four automatic gain control modules, each connected to a different one of said filters, each module including means for rectifying a signal applied thereto from one of said filters and for comparing said rectified signal to a reference voltage to generate a DC control voltage;
   d. means connecting each of said modules to a different one of said gain-controlling components for applying said control voltages thereto, to form a plurality of gain control loops;
   e. each of said gain control loops providing a gain-frequency control characteristic different from each other gain control loop; and
   f. the first of said predetermined frequencies being near the highest frequency of said frequency range, the second of said predetermined frequencies being near the lowest frequency in said frequency range and the third and fourth predetermined frequencies each being intermediate said first and second predetermined frequencies.

2. The amplifier defined in claim 1, wherein each of said means for connecting each of said modules to a different one of said gain-controlling components comprises an RC network having a faster charge time than discharge time to render said gain control loops responsive to peak signal levels.

3. The amplifier defined in claim 1, wherein the gain-frequency control characteristic for the frequency near the highest frequency of said frequency range provides gain control at that frequency and provides approximately one-half the amount of gain control, on a logarithmic basis, at one-fourth of said frequency.

4. The amplifier defined in claim 3, wherein a second gain-frequency control characteristic provides control at said second frequency, proportionately less control at said third and fourth frequencies, and insignificant control near the highest frequency of said frequency range.

5. The amplifier defined in claim 1, wherein said first frequency is near the frequency of Channel 13, said second frequency is near the frequency of Channel 2, said third frequency is near the frequency of Channel 7 and said fourth frequency is near the frequency of Channel 6.

* * * * *